United States Patent [19]

Goff

[11] 4,416,973

[45] Nov. 22, 1983

[54] RADIATION-SENSITIVE POLYIMIDE PRECURSOR COMPOSITION DERIVED FROM A DIARYL FLUORO COMPOUND

[75] Inventor: David L. Goff, Springfield, Pa.

[73] Assignee: E. I. Du Pont de Nemours & Co., Wilmington, Del.

[21] Appl. No.: 427,415

[22] Filed: Sep. 29, 1982

Related U.S. Application Data

[63] Continuation-in-part of Ser. No. 336,765, Jan. 4, 1982, abandoned.

[51] Int. Cl.$^3$ .............................................. G03C 1/68
[52] U.S. Cl. .................................. 430/281; 430/283; 430/288; 430/916; 430/919; 204/159.16; 204/159.18; 204/159.19
[58] Field of Search ............... 430/281, 283, 288, 916, 430/919; 204/159.16, 159.18, 159.19

[56] References Cited

U.S. PATENT DOCUMENTS

| | | | |
|---|---|---|---|
| 3,479,185 | 11/1969 | Chambers | 430/919 |
| 3,957,512 | 5/1976 | Kleeberg et al. | 430/283 |
| 4,271,259 | 6/1981 | Breslow et al. | 430/283 |
| 4,310,641 | 1/1982 | Ohmura et al. | 430/283 |
| 4,311,785 | 1/1982 | Ahne et al. | 430/283 |

Primary Examiner—Jack P. Brammer

Attorney, Agent, or Firm—William H. Thrower

[57] ABSTRACT

A radiation-sensitive polyimide precursor composition comprises a polymer of the formula

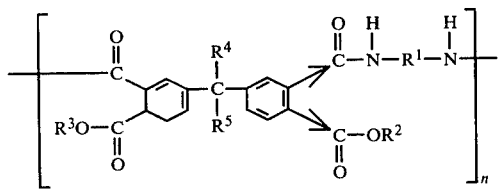

wherein n is a positive integer corresponding to the number of units in the polymer and is sufficiently large to provide the polymer with a number average molecular weight of about 1500–15,000 as determined by vapor pressure osmometry, and wherein for any particular unit in the polymer:→denotes isomerism; $R^1$ is a divalent aromatic, aliphatic or cycloaliphatic radical containing at least 2 carbon atoms; $R^2$ and $R^3$ are selected from the group consisting of a hydrogen radical and any organic radical containing a photopolymerizable olefinic double bond; and $R^4$ and $R^5$ are selected from the group consisting of perfluoro and perhalofluoro aliphatic hydrocarbons having 1 to 8 carbons.

17 Claims, No Drawings

RADIATION-SENSITIVE POLYIMIDE PRECURSOR COMPOSITION DERIVED FROM A DIARYL FLUORO COMPOUND

CROSS REFERENCE TO RELATED APPLICATIONS

This application is a continuation-in-part of U.S. application Ser. No. 336,765, filed Jan. 4, 1982, now abandoned.

BACKGROUND OF THE INVENTION

This invention relates to a radiation-sensitive or photopolymerizable polyimide precursor composition derived from a diaryl fluoro compound, especially 2,2-bis(3,4-carboxyphenyl)-hexafluoropropane dianhydride, that is useful for forming relief structures on electrical or electronic devices such as semiconductors, capacitors, and printed circuits.

Photopolymerizable polymeric compositions used to form relief structures on electronic devices are well known as shown in, for example: U.S. Pat. No. 3,953,877, issued Apr. 27, 1976, to Sigusch et al.; U.S. Pat. No. 3,957,512, issued May 18, 1976, to Kleeburg; and U.S. Pat. No. 4,040,831, issued Aug. 9, 1977, to Rubner et al. (now U.S. Pat. No. Re. 30,186, reissued Jan. 8, 1980).

The present invention provides for a novel radiation-sensitive polyimide precursor composition derived from a diaryl fluoro compound, especially 2,2-bis(3,4-dicarboxyphenyl)-hexafluoropropane dianhydride.

SUMMARY OF THE INVENTION

A radiation-sensitive polyimide precursor composition comprises:

1. a polymer of the formula

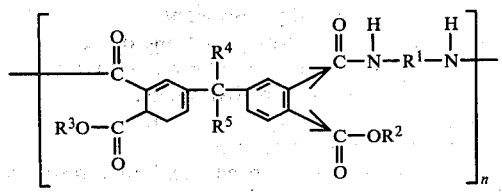

wherein n is a positive integer corresponding to the number of units in the polymer and is sufficiently large to provide the polymer with a number average molecular weight of about 1500–15,000 as determined by vapor pressure osmometry, and wherein for any particular unit in the polymer: → denotes isomerism; $R^1$ is a divalent aromatic, aliphatic or cycloaliphatic radical containing at least 2 carbon atoms; $R^2$ and $R^3$ are selected from the group consisting of a hydrogen radical and any organic radical containing a photopolymerizable olefinic double bond, at least one of $R^2$ and $R^3$ being said organic radical; and $R^4$ and $R^5$ are selected from the group consisting of perfluoro and perhalofluoro aliphatic hydrocarbons having 1 to 8 carbons;

2. a radiation sensitive polymerizable polyfunctional acrylate compound; and
3. a photopolymerization initiator system comprising hydrogen donor initiator and aromatic biimidazole.

DETAILED DESCRIPTION OF THE INVENTION

The radiation-sensitive polyimide precursor composition of the present invention is useful to form relief structures on electrical or electronic devices such as capacitors and semiconductors. A solution of the composition is applied to a substrate such as a silicon wafer and dried to form a film on the substrate. The film is then exposed to radiation through a masking template (pattern) and photopolymerized. The unexposed and unpolymerized part of the film is dissolved off with a developer solution to form a relief structure. The resulting relief structure is baked to eliminate the photopolymerized material and to form a polyimide structure with a sharp definition and with good mechanical, chemical and electrical properties.

A radiation-sensitive polyimide precursor composition of the present invention comprises:

1. a polymer of the formula

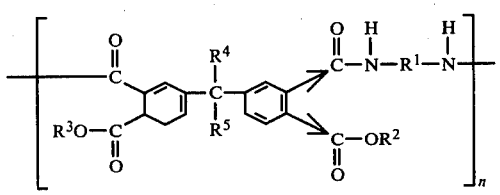

wherein n is a positive integer corresponding in the polymer and is sufficiently large to provide the polymer with a number of average molecular weight of about 1500–15,000 as determined by vapor pressure osmometry, and wherein for any particular unit in the polymer: → denotes isomerism; $R^1$ is a divalent aromatic, aliphatic or cycloaliphatic radical containing at least 2 carbon atoms; $R^2$ and $R^3$ are selected from the group consisting of a hydrogen radical and any organic radical containing a photopolymerizable olefinic double bond, at least one of $R^2$ and $R^3$ being said organic radical; and $R^4$ and $R^5$ are selected from the group consisting of perfluoro and perhalofluoro aliphatic hydrocarbons having 1 to 8 carbons;

2. a radiation sensitive polymerizable polyfunctional acrylate compound; and
3. a photopolymerization initiator system comprising hydrogen donor initiator and aromatic biimidazole.

In the above-described polymer wherein $R^4$ and $R^5$ are selected from the group consisting of perfluoro and perhalofluoro aliphatic hydrocarbons having 1 to 8 carbons, perfluoro and perhalofluoro designate materials which do not contain hydrogen. Instead, the hydrogen is substituted totally by fluorine (perfluoro) or at least 1 fluorine and another halogen (perhalofluoro). In a particularly preferred composition of the present invention, $R^4$ and $R^5$ of the polymer have the formula $CF_3$.

The polymer of the formula

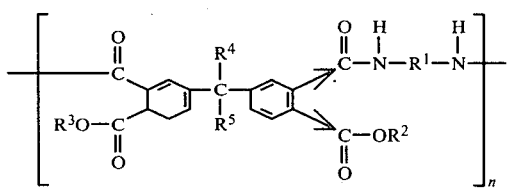

wherein $R^1$, $R^2$, $R^3$, $R^4$, $R^5$ and n are as defined earlier, may be prepared by one of at least two methods.

One method involves preparing the addition product of an olefinically unsaturated monoepoxide on a product obtained by reacting a polycarboxylic dianhydride of the formula

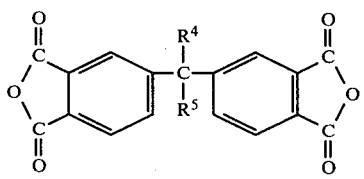

where $R^4$ and $R^5$ are as defined earlier, with at least one organic diamine having the structural formula $H_2N—R^1—NH_2$ wherein $R^1$ is a divalent radical containing at least 2 carbon atoms, the two amino groups of said diamine each attached to separate carbon atoms of said divalent radical.

In a particularly preferred method of preparing a composition of the present invention, $R^4$ and $R^5$ of said polycarboxylic dianhydride have the formula $CF_3$, so that the dianhydride is 2,2-bis(3,4-dicarboxyphenyl)-hexafluoropropane dianhydride.

The 2,2-bis(3,4-dicarboxyphenyl)-hexafluoropropane dianhydride preferably utilized in the reaction product described above may be prepared in the manner detailed in U.S. Pat. No. 3,310,573, issued Mar. 21, 1967, to Coe; said patent being hereby incorporated by reference into the present disclosure.

Suitable diamines include those described in more detail in U.S. Pat. Nos. 3,179,614 and 3,179,634, both issued Apr. 20, 1965, to Edwards; said patents being hereby incorporated by reference into the present disclosure. Also suitable are those diamines disclosed in the Coe patent (U.S. Pat. No. 3,310,573), as well as those disclosed in U.S. Pat. No. 3,959,350, issued May 25, 1976, to Rogers (also incorporated herein by reference).

Suitable diamines disclosed in the above-referenced patents to Edwards include aromatic diamines of the formula $H_2N—R^1—NH_2$ wherein $R^1$ is a divalent benzenoid radical selected from the group consisting of

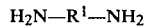

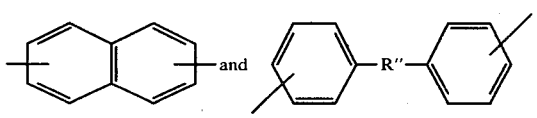

wherein R'' is selected from the group consisting of an alkylene chain having 1–3 carbon atoms,

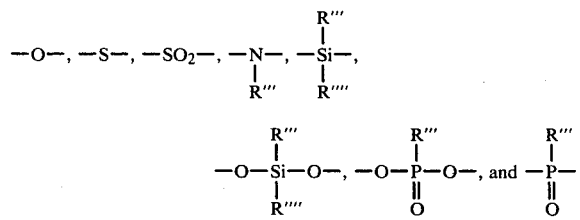

where R''' and R'''' are radicals having 1–6 carbon atoms selected from the group consisting of alkyl and aryl. Diamines disclosed in the above-referenced patent to Rogers additionally include diamines of the formula $H_2H—R^1—NH_2$ wherein $R^1$ is

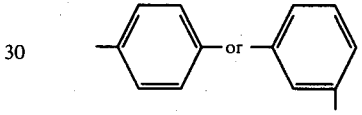

Exemplary diamines of such structure include:
4,4'-diamino-diphenyl ether;
4,4'-diamino-diphenyl sulfide;
4,4'-diamino-diphenyl sulfoxide;
4,4'-diamino-diphenyl sulfone;
4,4'-diamino-diphenyl diethylsilane;
4,4'-diamino-diphenyl diphenylsilane;
4,4'-diamino-diphenyl ethyl phosphine oxide;
4,4'-diamino-diphenyl phenyl phosphine oxide;
4,4'-diamino-diphenyl N-methyl amine;
4,4'-diamino-diphenyl N-phenyl amine;
1,3-bis(4-aminophenoxy)benzene;
1,4-bis(4-aminophenoxy)benzene; and mixtures thereof.

Suitable diamines disclosed in the above-referenced patent to Coe include diaryl fluoro diamines having the structure

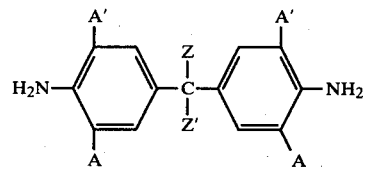

wherein Z and $Z^1$ have the formula $CCl_mF_{3-m}$, where m is 0 to 1, A and A' are selected from the group consisting of H, Cl, Br, and $NO_2$.

Exemplary diamines within this structure include:
4,4'-(hexafluoroisopropylidene)-dianiline;
4,4'-(hexafluoroisopropylidene)-bis(2,6-dibromoaniline);
4,4'-(hexafluoroisopropylidene)-bis(2-nitroaniline);
4,4'-(hexafluoroisopropylidene)-bis(0-phenylene diamine);

4,4'-(hexafluoroisopropylidene)-bis(2-aminotoluene);
4,4'-(hexafluoroisopropylidene)-bis(aminobenzoic acid);
4,4'-(hexafluoroisopropylidene)-bis(2,6-dichloroaniline);
4,4'-(hexafluoroisopropylidene)-bis(N-methylaniline);
4,4'-(hexafluoroisopropylidene)-bis(N-ethylaniline);
4,4'-(hexafluoroisopropylidene)-bis(N-2-cyanoethylaniline);
4,4'-(hexafluoroisopropylidene)-bis(2-nitro-6-chloroaniline);
4,4'-(chloropentafluoroisopropylidene)dianiline;
4,4'-(chloropentafluoroisopropylidene)-bis(2,6-dibromoaniline);
4,4'-(chloropentafluoroisopropylidene)-bis(N,2-cyanoethylaniline);
4,4'-(chloropentafluoroisopropylidene)-bis(2-aminotoluene);
4,4'-(1,3-dichlorotetrafluoroisopropylidene)dianiline;
4,4'-(1,3-dichlorotetrafluoroisopropylidene)-bis(2-aminotoluene).

Any suitable solvent for reacting the polycarboxylic dianhydride with the diamine may be used. Such suitable solvents are those organic solvents whose functional groups do not react with either the dianhydride or diamine to a greater extent than the latter do with each other. Besides being inert to the system and, preferably, being a solvent for the product, the organic solvent must be a solvent for at least one of the reactants (dianhydride or diamine), preferably for both of the reactants. A more detailed description of such suitable solvents may be found in the two Edwards patents (U.S. Pat. No. 3,179,614 and U.S. Pat. No. 3,179,634) and the Rogers patent (U.S. Pat. No. 3,959,350).

The suitable conditions for reacting the dianhydride and diamine are also disclosed in detail in the Edwards patents and the Rogers patent.

As noted above, an olefinically unsaturated monoepoxide is added onto the reaction product prepared from the dianhydride and diamine. Such monoepoxides have the formula

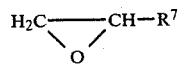

wherein $R^7$ is an olefinically unsaturated radical, preferably containing a (meth)acrylic ester-containing group.

Preferred olefinically unsaturated monoepoxides are the unsaturated epoxides glycidyl acrylate and glycidal methacrylate.

As an example, the following formula shows an addition product of glycidyl methacrylate on the product obtained by reacting 2,2-bis(3,4-dicarboxyphenyl)-hexafluoropropane dianhydride with 4,4'-diamine diphenyl ether:

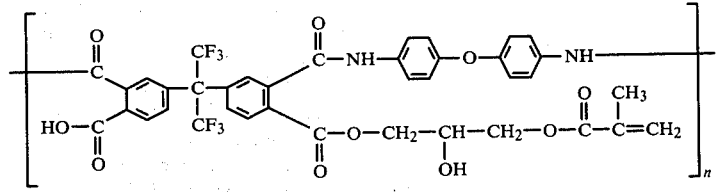

Preferably, a composition of the addition product in a solvent for the dianhydride/diamine reaction, will contain about 10–50% by weight, based on the combined weight of the addition product and solvent, of the addition product and about 50–90% by weight of the solvent.

In preparing the addition product of the monoepoxide on a dianhydride/diamine reaction product, it is advantageous to bring the dianhydride/diamine reaction product (a polyamic acid) to reaction with hydroxyethyl acrylate, hydroxyethyl methacrylate, or a combination of the two prior to the reaction with the olefinically unsaturated monoepoxide. In this manner, the end-position acid anhydride groups are intercepted or bound, and compounds with a clearly defind structure are obtained. The solubility also can be influenced by means of this intercept reagent, and, particularly, photosensitivity of the addition product is enhanced due to the unsaturated nature of this intercept reagent.

A second method for preparing the polymer of the formula

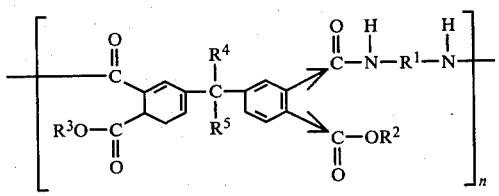

wherein $R^1$, $R^2$, $R^3$, $R^4$, $R^5$ and n are as defined earlier, is disclosed in the aforementioned Rubner U.S. Pat. No. Re. 30,186; said reissue patent being herein incorporated by reference. The Rubner method involves esterifying an aromatic polycarboxylic acid anhydride with a hydroxy alkyl acrylate or methacrylate, then converting that esterification product to a corresponding acid chloride derivative, and finally reacting said acid chloride derivative with diamine.

The aromatic polycarboxylic acid anhydride utilized is, of course, of the formula

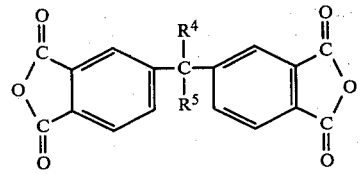

where $R^4$ and $R^5$ are as described earlier. Again, a particularly preferred dianhydride is 2,2-bis(3,4-dicarboxyphenyl)-hexafluoropropane dianhydride, the preparation of which is described earlier.

Also, suitable diamines include those described above, and detailed in the two Edwards, the Coe, and the Rogers patents.

Typical hydroxy alkyl acrylates and methacrylates are as follows: hydroxyethyl acrylate, hydroxypropyl acrylate, hydroxy butyl acrylate, hydroxy ethyl methacrylate, hydroxypropyl methacrylate, hydroxybutyl methacryate and the like.

Thionyl chloride typically may be used to convert the esterification product to a corresponding acid chloride.

Typical solvents in which the esterification of the dianhydride and subsequent reaction of the acid chloride derivative with diamine can take place, include butyrolactone, tetrahydrofuran, hexamethylphosphoric acid triamide, and combinations of the above. Other suitable solvents include those disclosed in the two Edwards and the Rogers patents and which do not react with the thionyl chloride or any other reagent used to form the acid chloride derivative.

The conditions for effecting such reactions are well-known, and are exemplified in the examples of the Rubner reissue patent.

To reduce radiation exposure time and increase the rate of photopolymerization of a polymer product of the type described above and prepared by any method, a photopolymerizable polyimide precursor composition of the present invention also comprises:

1. about 5–30% by weight, based on the weight of the polymer product, of a radiation sensitive polymerizable polyfunctional acrylate compound; and
2. about 0.5–20% by weight, based on the weight of the polymer product, of a photopolymerization initiator system comprising hydrogen donor initiator and aromatic biimidazole.

Typically useful radiation sensitive polymerizable polyfunctional acrylate compounds are as follows: trimethylol propane trimethacrylate, trimethylol propane triacrylate, trimethylol propane ethoxylate trimethacrylate, trimethylol propane ethoxylate triacrylate, trimethylol propane polyethoxylate trimethacrylate, trimethylol propane polyethoxylate triacrylate and mixtures thereof. Preferred are trimethylol propane polyethoxylate triacrylate having a weight average molecular weight of about 500–1500 and trimethylol propane ethoxylate triacrylate, pentaerythritol triacrylate, polyethylene glycol diacrylate, triethylene glycol diacrylate, polyethylene glycol dimethacrylate, polymethylene diacrylate, polyethylene dimethacrylate, trimethylene glycol dimethacrylate.

It is possible to photopolymerize the composition without the use of the above polymerizable polyfunctional acrylate compounds in the composition. For most practical commercial processes, the presence of the polyfunctional acrylate compounds is highly preferred, as it reduces photopolymerization time.

All molecular weights made reference to herein are determined by vapor pressure osmometry.

Typical aromatic biimidazole photopolymerization initiators are disclosed by Chambers U.S. Pat. No. 3,479,185 issued Nov. 18, 1969 and Cescon U.S. Pat. No. 3,784,557 issued Jan. 9, 1974 which are hereby incorporated by reference. A 2,4,5-triphenyl imidazolyl dimer having an ortho substituent on the 2 phenyl ring is a particularly useful initiator. Typical initiators of this type are 2-o-chlorophenyl-4,5-diphenyl imidazolyl dimer, 2-(o-fluorophenyl)-4,5-diphenyl imidazolyl dimer, 2-(o-methoxyphenyl)-4,5-diphenyl imidazolyl dimer and mixtures thereof. Particularly preferred are bis(2-o-chlorophenyl-4,5-diphenyl imidazolyl) and bis[2-o-chlorophenyl4,5-di(m-methoxy phenyl)imidazolyl] since these initiators are stable and are excellent photopolymerization initiators.

Also hexaaryl biimidazoles can be used as photopolymerization initiators as shown in Fishman U.S. Pat. No. 3,552,973 issued Jan. 5, 1971.

Typically useful hydrogen donors, photosensitizers and photoinitiators include the following: aromatic ketones such as benzophenone, Michler's ketone [4,4'-bis(dimethylamino)benzophenone], 4,4'-bis(diethylamino)benzophenone, 4-acryloxy-4'-diethylaminobenzophenone, 4-methoxy-4'-dimethylaminobenzophenone, 2-ethylanthraquinone, phenanthraquinone, 2-t-butylanthraquinone, 1,2-benzanthraquinone, 2,3-benzanthraquinone, 2,3-dichloronaphthoquinone, benzil dimethyl ketal, and other aromatic ketones such as disclosed in the aforementioned U.S. Pat. No. 3,552,973; benzoin, benzoin ethers such as benzoin methyl ether, benzoin ethyl ether, benzoin isobutyl ether, and benzoin phenyl ether, methylbenzoin, ethylbenzoin and other benzoins, mercaptobenzothiazole, mercaptobenzoxazoles as disclosed in U.S. Pat. No. 4,291,115 and n-phenyl glycine.

It is possible to use combinations of both photosensitizer and photopolymerization initiators. Generally, the photopolymerization time is longer if the photosensitizer is not added. As the photopolymerization is enhanced by the addition of photosensitizers, photoinitiators, or mixtures thereof, it is preferred that such compounds be used in the composition in amounts of about 0.1 to 15% by weight, of the composition.

It may be desirable to have a compound present that changes color when polymerization is complete, that is a hydrogen donor that provides a rapid start for polymerization, and that is a chain transfer agent. Leuco dyes can be used such as those disclosed in the aforementioned U.S. Pat. No. 3,552,973 col. 6, line 6, to col. 11, line 9, which disclosure is hereby incorporated by reference. Typically useful dyes are alkyl aminoaromatic alkanes such as tris(diethylamino-o-tolyl) methane, tris(dimethylamino-o-oxylyl) methane and tris(dipropyl amino-o-tolyl) methane.

Plasticizers can also be added to the composition of the present invention in amounts of 0.1–10% by weight, based on the weight of the polymer product. Typical plasticizers are tricresyl phosphate, dioctyl phthalate, dihexyl phthalate, dinonyl phthalate, polyethylene glycol ethers, ethylene glycol dicaprolate.

In the process for applying the composition to substrates, the composition is applied and then dried to form a film at about 30°–100° C. for about 20 minutes to 5 hours, depending upon the coating thickness. The film is then exposed to actinic radiation through a pattern for about 1 second to 5 minutes. Preferably, for a commercial process exposure times of 1–60 seconds are required and usually an exposure time under 30 seconds is much preferred. Typical radiation sources used are ultraviolet lamps providing a wave length of 250 to 400 nanometers and an intensity of 0.5–60 milliwatts per square centimeter (mW/cm$^2$). After exposure, the film is then dipped or sprayed, with a developer solution. Typical developer solutions are 4-butyrolactone/toluene in a weight ratio from 2/1 to 1/4, dimethyl formamide/ethanol in a weight ratio from 2/1 to 1/4.

The film is then washed with a nonsolvent and afterwards, dried. The film is cured to a polyimide relief structure by baking at about 150°–450° C. for about 20 minutes to 4 hours. During curing, the acrylate components are decomposed leaving a formed polyimide structure. The resulting relief structure has a sharp definition, as well as good chemical, electrical and mechanical properties.

Typical uses for the composition are as follows: protective coatings for semiconductors, dielectric layers for multilayer integrated circuits, high temperature solder mask, bonding multilayer circuits, a final passivating coating on electrical electronic devices and the like.

The following example illustrates the invention. All parts and percentages are on a weight basis, unless otherwise specified, and molecular weights are determined by vapor pressure osmometry.

EXAMPLE

Composition A (Polymer Product)

To a stirred solution of 33.3 grams (0.075 mol) of 2,2-bis(3,4-dicarboxyphenyl)-hexafluoropropane dianhydride in 115 milliliters of dimethylacetamide, 11.26 grams (0.056 mol) of 4,4'-diamino-diphenyl ether were added in about 2-gram lots such that the internal reaction temperature did not exceed 35° C. This mixture was then stirred at room temperature for 2 hours, after which 0.5 grams (0.004 mol) of hydroxyethyl methacrylate was added and the mixture stirred at room temperature for 2 more hours.

Then, 37.5 milliliters of glycidyl methacrylate (GMA), 0.4 grams of benzyldimethylamine, and 0.03 grams of hydroquinone were added in that order. The mixture was then warmed to between about 50° to 60° C. and stirred for 15 hours.

The reaction solution was then cooled to room temperature and washed with 5×50 milliliters of petroleum ether to remove unreacted GMA. The polymer product was isolated by the dropwise addition of the reaction solution into 1,000 milliliters of a blend of aromatic hydrocarbons (such as is sold by Union Oil Chemical Division as "Super High Flash Naphtha H-596") accompanied by vigirous stirring. The resulting gelatinous precipitate was triturated with 2×500 milliliters of petroleum ether and suction filtered to yield the product as a white solid (Composition A) with an acid number of 77.5. Infrared spectra data indicated carbonyl frequencies of 1720 and 1630 cm$^{-1}$.

Composition B

A photopolymerizable polyimide precursor composition of the present invention was prepared by charging the following constituents into a container and placing the container on a roller where it was mixed for 2 hours:

| Ingredient | Amount |
| --- | --- |
| Composition A | 5.0 grams |
| Bis(2-o-chlorophenyl-4,5-diphenylimidazolyl) | 0.3 grams |
| Michler's ketone (tetramethyl diaminobenzophenone) | 0.15 grams |
| Tris(diethylamino-o-tolyl) methane | 0.10 grams |
| Tetraethylene glycol diacrylate | 0.75 grams |
| N—methylpyrrolidone | 9.70 grams |
| Ethylene glycol monoethyl ether | 1.70 grams |

The above Composition B was filtered through a 1 micrometer filter.

A 2-inch diameter silicon wafer was coated with an aminosilane adhesion promoter solution by a spin coating technique wherein the wafer was rotated at 3000 rpm for 30 minutes after the adhesion promoter solution was applied.

Then, Composition B was applied to the wafer by the above spin technique using 3000 rpm for 60 seconds. This wafer with a coating of Composition B was then dried for 2 hours at 50° C., after which it was exposed to an ultraviolet light source of 365 nanometers (nm) and an intensity of about 5 mW/cm$^2$, said light passing through a masking template.

The wafer was then developed by dipping it for 20 seconds in a 1/1 solution of 4-butyrolactone/toluene and then rinsing it for 10 seconds with a spray of toluene to remove any unexposed composition. The wafer was then spun dry at 3000 rpm for 60 seconds. The wafer was, finally, heated and held at about 300° C. for 1 hour to provide a polyimide relief structure of an electronic circuit, which is characterized by sharp, clean lines spaced as little as 3 microns apart, as examined under magnification at 150×.

What is claimed is:

1. A radiation-sensitive polyimide precursor composition, comprising:
   a. a polymer of the formula

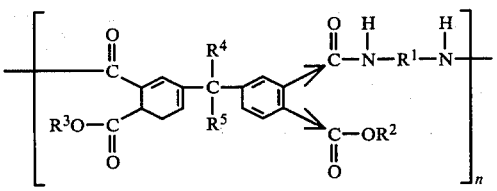

wherein n is a positive integer corresponding to the number of units in the polymer and is sufficiently large to provide the polymer with a number average molecular weight of about 1500–15,000 as determined by vapor pressure osmometry, and wherein for any particular unit in the polymer: → denotes isomerism; $R^1$ is a divalent aromatic, aliphatic or cycloaliphatic radical containing at least 2 carbon atoms; $R^2$ and $R^3$ are selected from the group consisting of a hydrogen radical and any organic radical containing a photopolymerizable olefinic double bond, at least one of $R^2$ and $R^3$ being said organic radical; and $R^4$ and $R^5$ are selected from the group consisting of perfluoro and perhalofluoro aliphatic hydrocarbons having 1 to 8 carbons;
   b. a radiation sensitive polymerizable polyfunctional acrylate compound; and
   c. a photopolymerization initiator system comprising hydrogen donor initiator and aromatic biimidazole.

2. A radiation-sensitive polyimide precursor composition as recited in claim 1 wherein $R^4$ and $R^5$ have the formula —$CF_3$.

3. A radiation-sensitive polyimide precursor composition as recited in claims 1 or 2 wherein $R^2$ and $R^3$ are selected from the group consisting of a hydrogen radical, a hydroxy alkyl acrylate radical, and a hydroxy alkyl methacrylate radical.

4. A radiation-sensitive polyimide precursor composition, as recited in claims 1 or 2, wherein:
   a. the radiation sensitive polymerizable polyfunctional acrylate compound is present in an amount equal to 5–30% by weight, of the polymer; and
   b. the photopolymerization initiator system comprising hydrogen donor initiator and aromatic biimidazole is present in an amount equal to 0.5–30%, by weight, of the polymer.

5. A radiation-sensitive polyimide precursor composition, as recited in claim 4 wherein $R^2$ and $R^3$ are selected from the group consisting of a hydrogen radical, a hydroxy alkyl acrylate radical, and a hydroxy alkyl methacrylate radical.

6. A radiation-sensitive polyimide precursor composition, as recited in claim 5, wherein said radiation sensitive polymerizable polyfunctional acrylate compound is selected from the group consisting of trimethylol propane trimethacrylate, trimethylol propane triacrylate, trimethylol propane ethoxylate trimethacrylate, trimethylol propane ethoxylate triacrylate, trimethylol propane polyethoxylate trimethacrylate, trimethylol propane polyethoxylate triacrylate, pentaerythritol triacrylate, polyethylene glycol diacrylate, triethylene glycol diacrylate, polyethylene glycol dimethacrylate, polymethylene diacrylate, polymethylene dimethacrylate, trimethylene glycol dimethacrylate and mixtures thereof.

7. A radiation-sensitive polyimide precursor composition, as recited in claim 6, in which said aromatic biimidazole of said photopolymerization initiator is selected from the group consisting of bis(2-o-chlorophenyl-4,5-diphenyl and imidazolyl) and bis[2-o-chlorophenyl-4,5-di(m-methoxyphenyl)imidazolyl].

8. A radiation-sensitive polyimide precursor composition, as recited in claim 7, wherein the composition also contains about 0.1–10% by weight, based on the weight of the polymer, of a leuco dye.

9. A radiation-sensitive polyimide precursor composition, as recited in claim 8, wherein the composition also contains about 0.1–15% by weight, based on the weight of the polymer, of a photosensitizer.

10. A method for the preparation of a radiation-sensitive polyimide precursor composition, as recited in claim 1, comprising:
a. reacting a polycarboxylic dianhydride of the formula

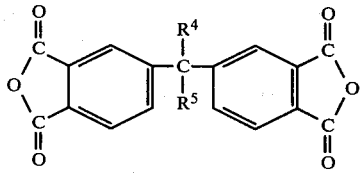

wherein $R^4$ and $R^5$ are as defined in claim 1, with at least one organic diamine having the structural formula

wherein $R^1$ is a divalent radical containing at least two carbon atoms, the two amino groups of said diamine each attached to separate carbon atoms of said divalent radical, in a suitable solvent at a temperature below about 75° C. to form a carboxyl group-containing reaction product;
b. reacting said reaction product with an olefinically unsaturated monoepoxide at a temperature from about room temperature to about 100° C. in an organic solvent to form an addition product;
c. adding to a solution of said addition product, a radiation-sensitive polymerizable polyfunctional acrylate compound; and
d. also adding to said solution a photopolymerization initiator system comprising hydrogen donor initiator and aromatic biimidazole.

11. A method, as recited in claim 10, wherein said polycarboxylic dianhydride is 2,2-bis(3,4-dicarboxyphenyl)-hexafluoropropane dianhydride.

12. A method, as recited in claim 11, wherein said olefinically unsaturated monoepoxide is selected from the group consisting of glycidyl acrylate and glycidyl methacrylate.

13. A method, as recited in claim 12 wherein said organic diamine is 4,4'-diamino-diphenyl ether.

14. A method for the preparation of a radiation-sensitive polyimide precursor composition, as recited in claim 1, comprising:
a. reacting a polycarboxylic dianhydride of the formula

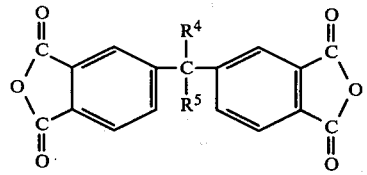

wherein $R^4$ and $R^5$ are as recited in claim 1, with a compound selected from the group consisting of hydroxy alkyl acrylates and hydroxy alkyl methacrylates to form an esterification product;
b. forming an acid chloride derivative of said esterification product;
c. reacting said acid chloride derivative with a diamine of the formula

wherein $R^1$ is a divalent radical containing at least 2 carbon atoms, the two amino groups of said diamine each attached to separate carbon atoms of said divalent radical, to form an addition product;
d. adding to a solution of said addition product, a radiation-sensitive polymerization polyfunctional acrylate compound; and
e. also adding to said solution a photopolymerization initiator system comprising hydrogen donor initiator and aromatic biimidazole.

15. A method, as recited in claim 14, wherein said polycarboxylic dianhydride is 2,2-bis(3,4-dicarboxyphenyl)-hexafluoropropane dianhydride.

16. A method, as recited in claim 15 wherein said organic diamine is 4,4'-diamino-diphenyl ether.

17. A method, as recited in claim 10, wherein the reaction product of the dianhydride and diamine is brought to reaction with a compound from the group consisting of hydroxyethyl acrylate, hydroxyethyl methacrylate, and a combination of the two, prior to the reaction with said olefinically unsaturated monoepoxide.

* * * * *